United States Patent [19]
Bui et al.

[11] Patent Number: 4,963,782
[45] Date of Patent: Oct. 16, 1990

[54] MULTIFREQUENCY COMPOSITE ULTRASONIC TRANSDUCER SYSTEM

[75] Inventors: Tuan Bui; Helen L. W. Chan, both of Carlingford; Joe Unsworth, Dundas, all of Australia

[73] Assignee: Ausonics Pty. Ltd., Lane Cove, Australia

[21] Appl. No.: 252,789

[22] Filed: Oct. 3, 1988

[51] Int. Cl.$^5$ .............................................. H01L 41/08
[52] U.S. Cl. ..................................... 310/358; 310/334
[58] Field of Search ................................. 310/357–359, 310/800, 316, 317, 334–337

[56] References Cited

U.S. PATENT DOCUMENTS

| | | | |
|---|---|---|---|
| 4,276,491 | 6/1981 | Daniel | 310/317 |
| 4,412,148 | 10/1983 | Klicker et al. | 310/358 |
| 4,658,176 | 4/1987 | Nakaya et al. | 310/357 X |
| 4,683,396 | 7/1987 | Takeuchi et al. | 310/358 |
| 4,801,835 | 1/1989 | Nagaya | 310/358 |

OTHER PUBLICATIONS

R. E. Newnham et al., "Composite Piezolectric Transducers", *Materials in Engineering;* vol. 2, Dec., 1980; pp. 93–106.

B. A. Auld, "High Frequency Piezoelectric Resonators", 1987 IEEE Int'l Symp. of Applications of Ferroelectrics, pp. 288–295.

*Primary Examiner*—Mark O. Budd
*Attorney, Agent, or Firm*—Gottlieb, Rackman & Reisman

[57] ABSTRACT

A multifrequency composite ultrasonic transducer system includes a transducer comprised of piezoelectric ceramic rods embedded in a polymer matrix. By selecting the appropriate thickness and width of ceramic rod, the transducer assembly can be made to resonate at a number of frequencies. One of the resonance frequencies is determined by the thickness of the ceramic rod; other resonance frequencies are determined by the width and/or the ratio of width to thickness of the ceramic rods.

26 Claims, 4 Drawing Sheets

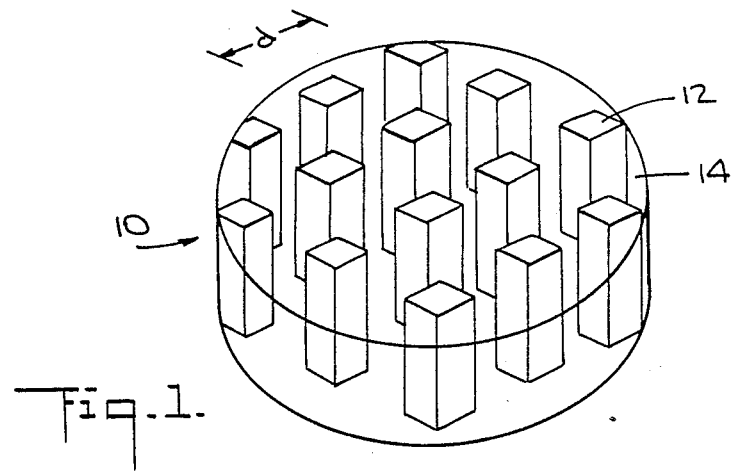
Fig. 1.
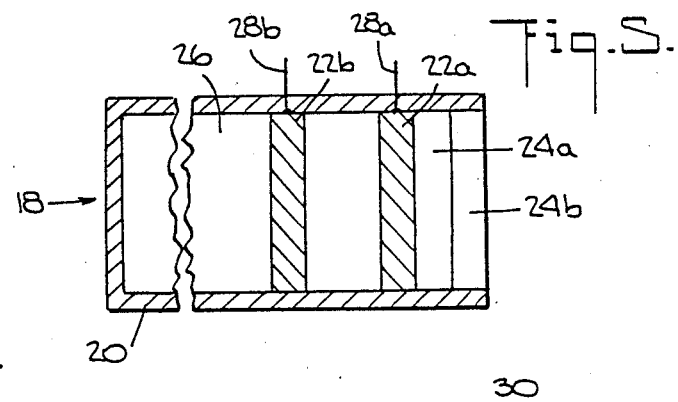
Fig. 5.
Fig. 6.
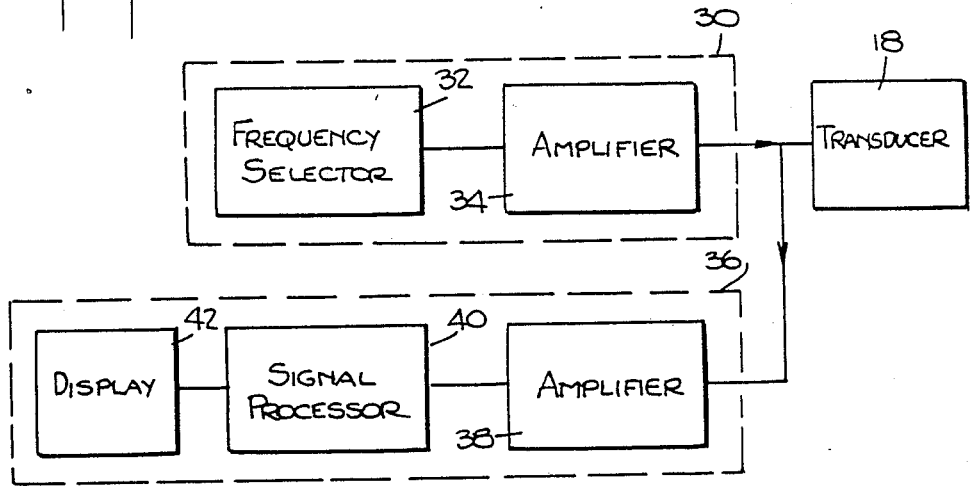

MULTIFREQUENCY COMPOSITE ULTRASONIC TRANSDUCER SYSTEM

TECHNICAL FIELD

This invention relates to multiple frequency ultrasonic transducer systems. More particularly, it relates to multiple frequency ultrasonic transducers and control means for utilizing the transducers in applications such as medical diagnostic equipment.

BACKGROUND ART

Ultrasound is used routinely to examine the interior of mechanical components or the human body. Generally, the pulse echo technique is used. This technique represents the most important application of ultrasound in medical diagnosis.

In the pulse echo technique, a short pulse of ultrasonic energy from an ultrasonic transducer is transmitted into the body. The frequency range is typically between 1 Megahertz and 30 Megahertz and generally in the range of 1 Megahertz to 8 Megahertz. Discontinuities in the acoustic impedance (the product of the velocity of sound and the density) of the tissue in the path of the ultrasound reflect some of the energy, thus forming an echo. The time taken for the echo to be returned to the transmitting transducer following the transmission of the initial pulse is a measure of the distance of the discontinuity from the transducer. In the pulse echo technique, the same ultrasonic transducer is used for both transmitting and receiving.

In medical applications, the difference in acoustic impedance between adjacent layers of tissues is small. Thus, the echoes reflected by the boundaries between the tissues are faint. However, these echoes may be detected by sensitive receivers, amplified and ultimately displayed on a television monitor as a line of varying intensity. The intensity may be made to depend on the strength of the received echoes. The transducer is scanned across the body as pulses are repeatedly generated and received, so as to generate a cross-sectional image of the body which is ultimately displayed on the monitor. Such ultrasonic "echography" has proved to be of value as a diagnostic aid in soft tissue areas such as the abdomen, pregnant uterus, eye, breast, brain, kidney, liver and heart.

In ultrasonic diagnostic equipment the transducer is the eye of the system. It is the only interface between the electronic system and the patient and is therefore one of the most important components of the system. In the pulse echo technique, the ultrasonic transducer transforms an applied voltage to ultrasonic energy and transforms echoes in the form of returning ultrasonic energy back to an electrical signal.

The basic component of an ultrasonic transducer used in the pulse echo technique is a piezoelectric element. When a voltage is applied to a piezoelectric element, the surfaces of the element move in synchronism with the applied voltage. Particles of a medium making contact with the surfaces are set in motion and an ultrasonic wave is propagated.

A piezoelectric transducer element operates at maximum efficiency when the frequency of the applied voltage is the same as its resonant frequency. The resonant frequency is inversely proportional to the thickness of the piezoelectric element.

The construction of a transducer is specialized for different applications. In general, for pulse echo applications, the transducer is designed to maximize the energy of the wave propagated from the front of the transducer and to minimize the energy loss from the back of the transducer.

When an ultrasonic transducer is excited, by an electrical impulse, there is a tendency for the piezoelectric material to continue oscillating or to "ring". However, to be of diagnostic value, a transducer must be well damped so as to produce short pulses which are needed to resolve fine structures in the body. This ability is called axial resolution. The axial resolution is proportional to the resonant frequency of the transducer. The higher the resonant frequency, the shorter the ultrasonic pulse and the better the axial resolution.

To increase the efficiency of the transducer, a quarter wavelength matching material is often applied to the front face of the piezoelectric element to match the high impedance of the piezoelectric element to the lower impedance of the tissues to be probed. Optimum matching is obtained by making the impedance of a quarter wave matching layer equal to the geometric mean of the impedance of the piezoelectric element and the impedance of the tissue. Transducers using quarter wave matching layers have a high sensitivity because most of the ultrasonic energy is radiated in the required forward direction and the received ultrasonic energy is efficiently coupled back o the piezoelectric element. Such transducers usually employ only a light backing (of relatively low acoustic impedance) which provides mechanical support for the piezoelectric element.

In addition to axial resolution, it is important that transducers be capable of transmitting to and receiving ultrasonic energy from tissues deep in the body so that deep lying structures can be examined. The ability to examiner these deep lying structures is called penetration. However, the attenuation of ultrasonic waves increases sharply with increases in frequency. Thus, a compromise must be found between good resolution and acceptable penetration.

In general, different frequencies of operation are used for different application:. In medical applications, the adult heart is examined at 3 Megahertz, a child's heart at 5 Megahertz and frequencies of 10-15 Megahertz are typical for examination of the adult eye.

During the ultrasonic examination of organs, it is often necessary to first examine with a high degree of penetration (for example to obtain an overall view of an organ) and then to look more closely at an area of interest with a higher resolution. Transducers which operate at single frequencies must be changed in the course of a procedure. This is difficult as it requires that the procedure be interrupted, equipment readjusted, the area of interest located again and the procedure resumed. If the area of interest within the body were to move, it would be difficult to find again with the high resolution transducer and thus the change in transducer would be effectively useless.

Under such circumstances, it is beneficial to be able to operate the transducer effectively at more than one frequency. The benefits of operating a transducer at more than one frequency are recognized in the art and are also useful in other applications of ultrasound such as in the field of non-destructive testing. A number of methods have been proposed to create a multiple frequency ultrasonic transducer. These are based o: laminating layers of piezoelectric ceramics of various thickness. A variety of operating frequencies can be obtain d by exciting one or more layers of the piezoelectric ceramics.

An example of such a transducer system is disclosed in U.S. Pat. No. 4,276,491 to Daniel entitled Focusing Piezoelectric Ultrasound Medical Diagnostic System, issued to the assignee of the present invention. Daniel discloses an ultrasonic piezoelectric transducer consisting of two separate transducer elements bonded together. By switching the electrodes which are connected to the transmit and receive circuits of an ultrasonic medical scanning apparatus, the single transducer may be used for imaging with high resolution at one frequency and for pulse Doppler velocity measurements at a different frequency. The two elements are driven in series for Doppler measurements and only the front element is used for pulse echo measurements. While quite satisfactory in terms of achieving its intended results, this approach does not make maximum use of the available piezoelectric elements to achieve maximum transducer sensitivity.

Composite materials have been developed to improve the characteristics of single phase material. The goal of such developments is to comb ne the desirable properties of two different constituent materials to produce a composite with superior characteristics. In piezoelectric composite materials, the desired properties of high electro-mechanical coupling coefficient $k_t$ and low acoustic impedance z has been achieved by combining a piezoelectric ceramic and a passive polymer. This composite structure, formally characterized by 1-3 connectivity consists of a two-dimensional arrays of parallel piezoelectric ceramic rods embedded in a polymer matric, as described in Composite Piezoelectric Transducers R. E. Newnham, et al., Materials in Engineering, Vol. 2, Dec., 1980, pp 3–106)

A considerable variety of properties can be achieved with these composites by varying the piezoelectric ceramic and polymer components, their volume fractions and the lateral spatial scale of the structure. The lateral spatial scale is determined by the relative width of the ceramic rod and the polymer gap. When the composite vibrates, the resonance characteristic of the composite is much more complex than that of a single phase ceramic disc.

The resonance characteristics of a ceramic disc are essentially a single fundamental resonant and a single fundamental anti-resonant frequency. The resonance frequency (fr) is inversely proportional to the thickness of the ceramic disc and is given by:

$$fr = Nt/t$$

Where:
Nt = the frequency constant of the ceramic material; and
t = thickness of the ceramic disc.

The resonance modes of a composite material are much more complex. While the complex nature of these resonances has been known, there has been no attempt to exploit the multifrequency characteristics of composite materials to produce a multifrequency transducer. This is probably due to the complex interaction between the modes of vibration, which results in mode which do not produce a "clean" response at a desired frequency. If such clean modes of vibration were produced, a composite transducer could be used, with an appropriate electronic system, for ultrasonic imaging at at least two different frequencies.

DISCLOSURE OF THE INVENTION

It is an object of the invention to produce a composite ultrasonic transducer useful for ultrasonic imaging at more than one frequency.

It is another object of the invention to produce a composite ultrasonic transducer with well defined and "clean" modes of vibration at at least two different frequencies.

It is yet another object of the invention to provide a procedure for designing such ultrasonic transducers.

It is still another object of the invention to provide a transducer system for using such transducers in the pulse-echo mode at more than one frequency.

In accordance with the invention an ultrasonic transducer system comprises an assembly including a plurality of rigid piezoelectric elements in a relatively less rigid matrix. The piezoelectric elements are arranged in the matrix in a 1-3 structure and preferably occupy between substantially twenty percent and substantially thirty percent by volume of the assembly. The piezoelectric elements are preferably square and have a width-to-thickness ratio selected to produce two fundamental resonant frequencies. One of these frequencies is a thickness mode of vibration of the piezoelectric elements. Another of these frequencies is a lateral mode of vibration, of the piezoelectric element. The width-to-thickness ratio of the piezoelectric elements is selected to be between substantially 1.0 and substantially 2.5.

The assembly is preferably in the form of a disk with the piezoelectric elements extending in a direction parallel to a longitudinal axis cf a disc. The piezoelectric elements extend from a first planar surface of the disc to a second planar surface of the disc. Electrical connection means contact these planar surfaces for making electrical connection to the assembly. A multifrequency electrical generator provides electrical excitation to the assembly and the piezoelectric elements thereof by way of the electrical connection means at at least two selected resonant frequencies of the piezoelectric elements. Ultrasonic signals produced by the transducer system as a result of these pulses and reflected to the transducer produce electrical signals in the transducer. The ultrasonic transducer system further includes a receiver for processing the signals. The receiver includes an amplifier for amplifying the electrical signals at the first frequency and at the second frequency. The receiver further includes a signal processing means for processing the electrical signals and a display means for producing a visual display from the processed signals.

BRIEF DESCRIPTION OF THE DRAWINGS

Further objects, features and advantages of the invention will become apparent upon consideration of the following detailed description in connection with the drawings, in which:

FIG. 1 is a perspective view of a composite piezoelectric/polymer composite disc having a 1-3 structure;

FIG. 5 is a schematic diagram of a transducer in accordance with the invention; and FIG. 6 is a schematic block diagram of a system using a transducer in accordance with the invention.

DETAILED DESCRIPTION OF THE PREFERRED EMBODIMENT

Referring to FIG. 1, a composite structure in the shape of a disc 10 includes a plurality of piezoelectric ceramic bars 12 in a polymer matrix 14. A distance "d" defines the periodicity or spacing between successive bars. In the embodiment illustrated in FIG. 1, bars 12 are disposed in the polymer 14 in a square matrix, extend parallel to the longitudinal axis of disc 10, and are of square cross section.

The ceramic is selected to have a high electromechanical coupling coefficient to produce a highly efficient transducer.

The polymer is selected to be a material with a low Poisson's ratio, i.e. relatively soft or non-rigid. This minimizes the coupling between the polymer and the ceramic. The polymer acts as a good barrier in decoupling vibration between the ceramic members. Where it is desirable to machine or grind the composite to a particular shape or thickness, an epoxy may be used. When flexibility is desired, a polyurathane is satisfactory.

Figure 2:
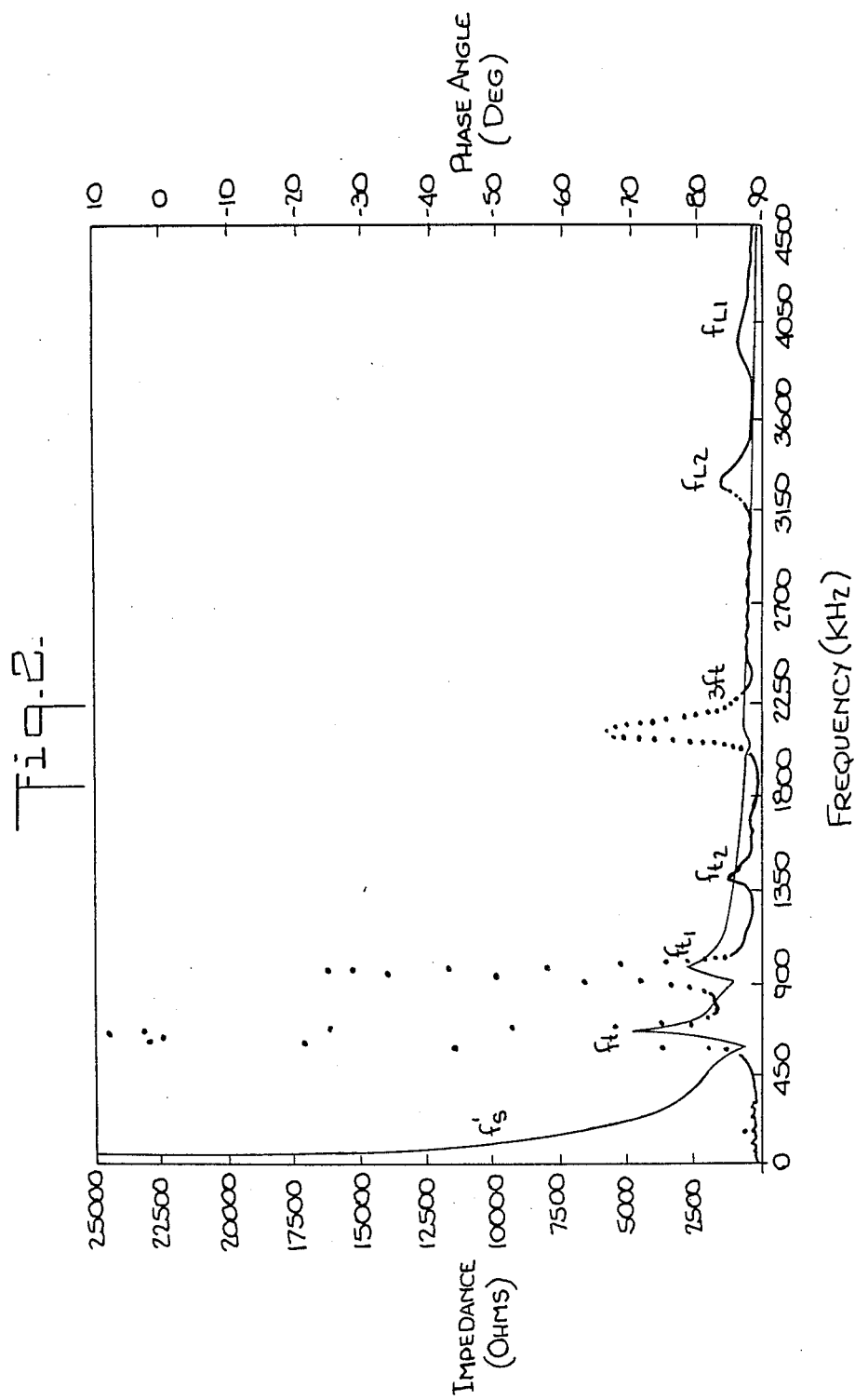
FIG. 2 is a graph of the resonance characteristics of a piezoelectric composite in accordance with the invention.

As illustrated in FIG. 2, the resonance characteristic of a composite is much more complex than that of a simple disc. Apart from the thickness mode resonance frequency as determined by the thickness of the ceramic rod, there are a number of resonance frequencies determined by:

1. Cooperative resonances of the composite structure which include:
    (i) The planar mode resonance $f_S'$, which is the lateral resonance of the composite disc as a whole.
    (ii) Stopband resonances, $f_{t1}$ and $f_{t2}$. These stopband resonances occur at frequencies near where Bragg reflections occur in the plane of the composite. For a fully electroded disc, the piezoelectrically coupled stopband resonances are the upper band edges of the second stopband for which one periodicity d = (1 polymer width + 1 ceramic width) = 1 shear wavelength. They are observed in FIG. 2 as additional resonances $f_{t1}$ and $f_{t2}$.

2. Characteristic resonances of the individual piezoelectric elements including:
    (i) Thickness mode resonance $f_t$, which is the mode used in conventional ultrasonic imaging.
    (ii) Lateral mode resonances $f_{L1}$ and $f_{L2}$.

The interaction of these resonance frequencies can be predicted and described by the frequency equation.

$$\begin{vmatrix} (f_a^2 - f^2) & \alpha f_a \cdot f_b & \gamma f_a^2 \\ \alpha f_a \cdot f_b & (f_b^2 - f^2) & \alpha f_a \cdot f_b \\ \gamma f_a^2 & \alpha f_a \cdot f_b & (f_a^2 - f^2) \end{vmatrix} = 0 \qquad (1)$$

where $$f_a = \frac{1}{2L}\sqrt{\frac{C_{11}}{\rho}} \text{ and } f_b = \frac{1}{2H}\sqrt{\frac{C_{33}}{\rho}}$$

L is the width and H is the thickness of the ceramic rod, $f_a$ is the uncoupled lateral resonance frequnecy and $f_b$ is the uncoupled thickness resonance frequency.

$$\alpha = \frac{C_{13}}{\sqrt{C_{11}C_{33}}} \text{ and } \gamma = \frac{C_{12}}{C_{11}}$$

$\alpha$ and $\gamma$ are the coupling constants, $C_{11}$, $C_{12}$, $C_{13}$, $C_{33}$ are the elastic stiffness constants of the material and $\rho$ is the density. Eqn. (1) can be factorised into:

$$\{f^2 - f_a^2(1-\gamma)\}\{f^4 - [f_a^2(1+\gamma) + f_b^2]f^2 + f_a^2 f_b^2(1+\gamma - 2\alpha^2)\} = 0$$

Hence $$f^2 - f_a^2(1-\gamma) = 0 \text{ or } f = \pm f_a(1-\gamma)^{\frac{1}{2}} \qquad (2)$$

are two solutions where the negative will be discarded for physical reasons. The biquadratic equation:

$$f^4 - [f_a^2(1+\gamma) + f_b^2]f^2 + f_a^2 f_b^2(1+\gamma - 2\alpha^2) = 0 \qquad (3)$$

will have four solutions and the two positive ones will be retained.

Figure 3:
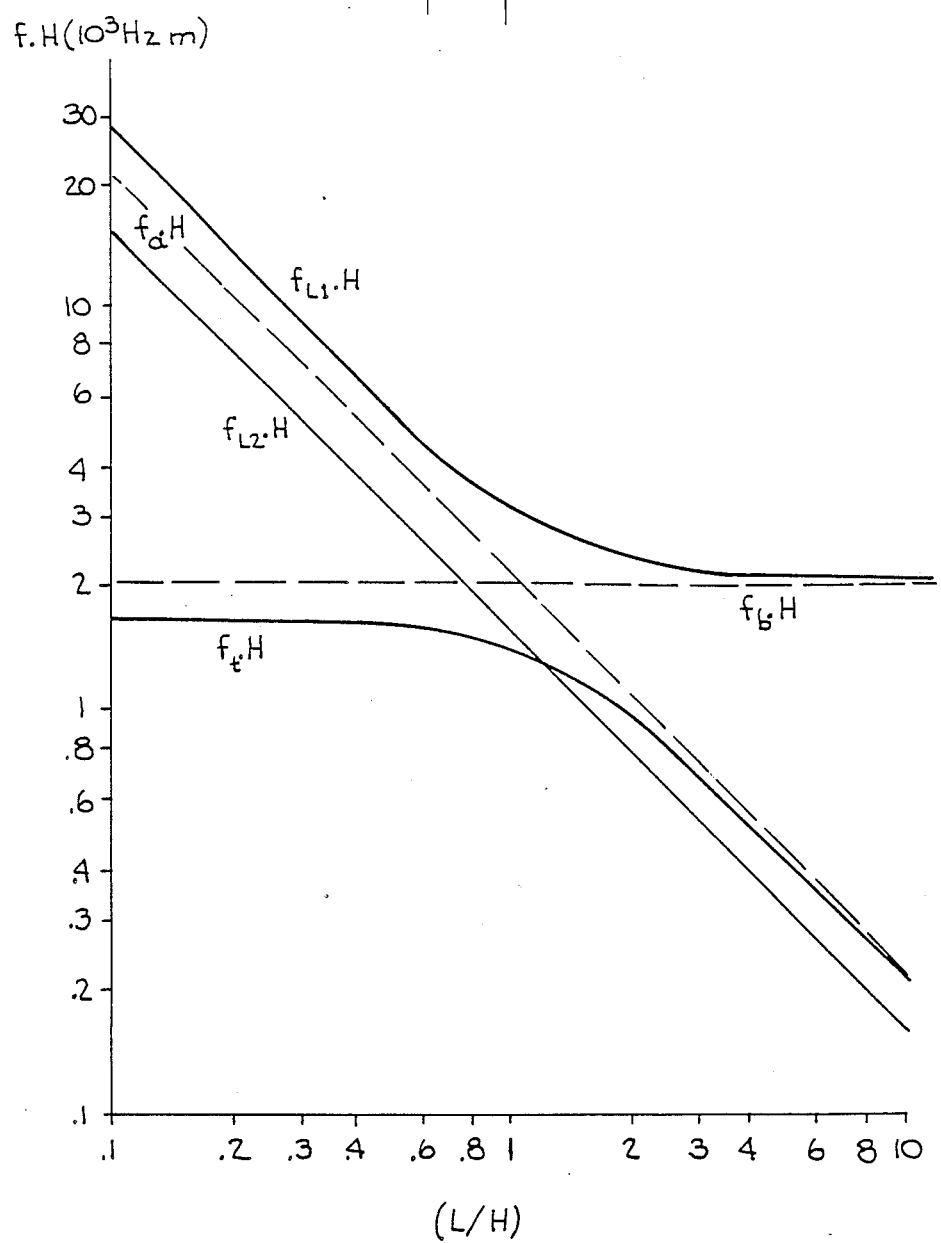
FIG. 3 is a graph of the frequency constant of a PZT7A/Araldite D 1-3 composite verses width-to-thickness ratio.

Using the material parameters for PZT 7A
$C_{12}^E = 7.62 \times 10^{10}$ N/m²
$C_{11}^E = 14.8 \times 10^{10}$ N/m²
$C_{33}^E = 13.1 \times 10^{10}$ N/m²
$\rho = 7600$ kg/m³ the frequency eqn. (1) is solved and plotted in FIG. 3.

Physically, it means that when the element is a tall thin pillar (H >> L or G = L/H << 1) the thickness mode and the lateral modes are well separated. The thickness mode frequency $f_t$ increases linearly with decrease in thickness while the lateral modes $f_{L1}$ and $f_{L2}$ stay quite constant and do not vary with thickness. As the thickness decreases, and G approaches 1, the element has the shape of a cube and the thickness and lateral modes are excited at the same time.

Therefore, it is possible to construct a multiple resonance frequency composite transducer by selecting G between 1 and 2.5 and to tailor the frequencies to suit the application.

Design Procedure and Result

The following procedure is used to design a dual frequency transducer resonanting at 2MHz and 5MHz. From the mode coupling theory, the low frequency $f_L$ is given by:

$$f_L = \frac{1}{2L}\sqrt{\frac{C_{11}^E}{\rho}(1-\gamma)} \qquad (4)$$

$f_L = 2$MHz; using value of $C_{11}^E$, $C_{12}^E$ and $\rho$ for PZT 7A, eqn. (4) gives:
L = 0.8 mm
From eqn. (1), the value of G to give another resonance frequency at 5MHz is 1.6. Hence the thickness of the composite is determined to be 0.45 mm.

A batch of five 2MHz and 5MHz dual frequency transducers were fabricated. Piezoelectric ceramic PZT 7A from Vernitron and Araldite D from Ciba-Geigy were used. The 1-3 composites were made using dice and fill technique. The volume percentage of the ceramic was 25. The ceramic and the polymer width were 0.8 mm and the composite discs were 0.45 mm thick. Chromium and gold electrodes were applied and wires attached using low temperature indium solder.

Figure 4:
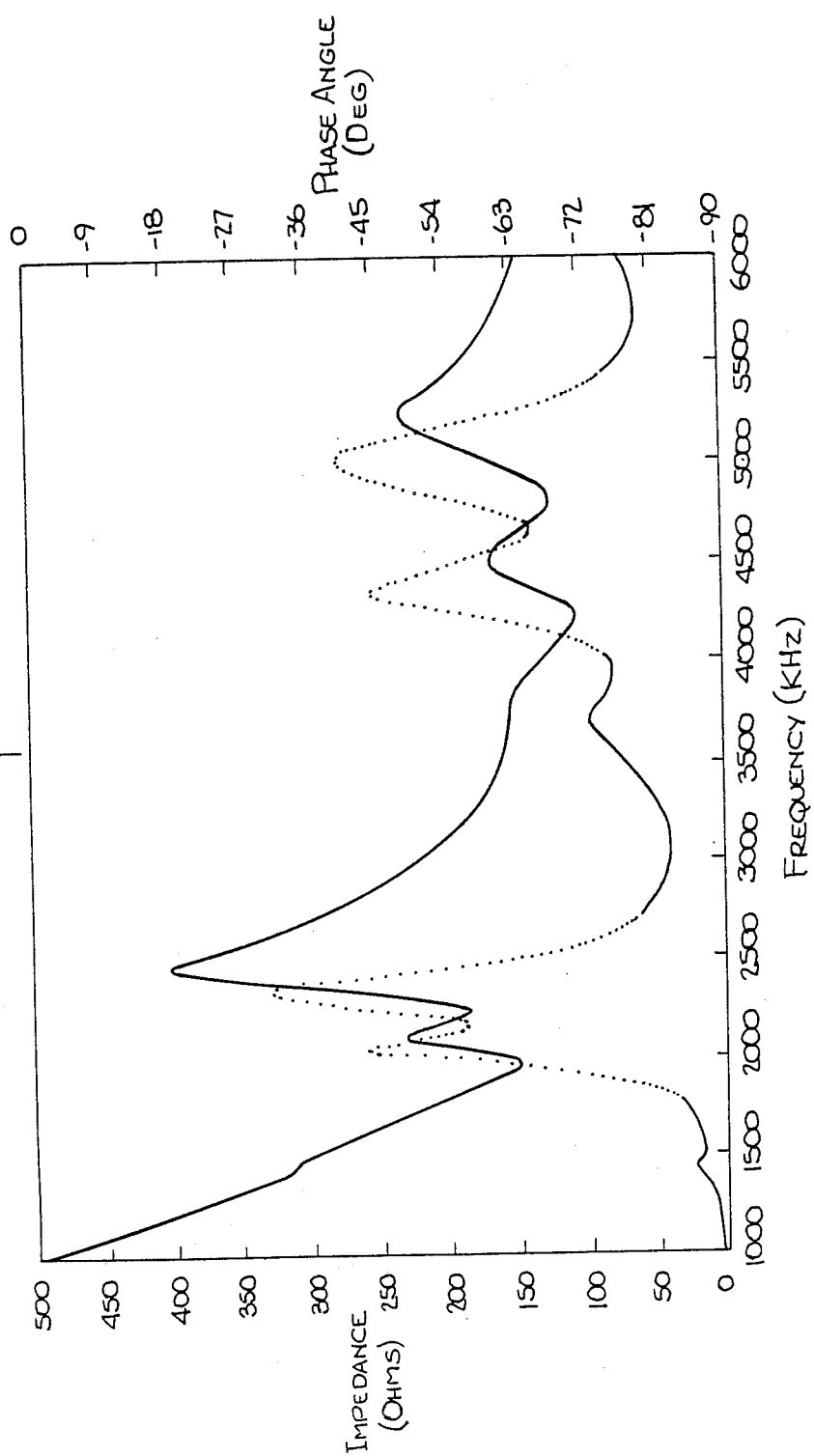
FIG. 4 is a graph of the input impedance of a composite disc, in accordance with the invention, verses frequency.

The diameter of the transducers was 14 mm. The transducers were slightly focused with the radius of curvature being 80 mm. They were housed with air backing and had no front matching layer. The impedance and phase of the transducer were measured using an HP 4192A Impedance Analyser and are shown in FIG. 4 as a function of frequency. The impedance shows two main resonances at approximately 2MHz and 5MHz.

The volume fraction of the ceramic is selected in the range mentioned above to optimize the charge constant $d_{33}$. For the geometry shown, the width of the ceramic is equal to the spacing when the ceramic occupies twenty five percent of the volume of the assembly.

The calculated frequency constants $H \times f$ of the composite for the low frequency $f_L$ and the high frequency $f_H$ as a function of width (L) to thickness (H) ratio (G=L/H) are shown in Table 1 for G between 1 and 2.5 and for $f_L=2$ Megahertz.

TABLE 1

| G | $H \cdot f_L$ | $H \cdot f_H$ | $f_H/F_L$ | $f_H$ (MHz) |
|---|---|---|---|---|
| 1 | 1.54 | 3.1 | 2.01 | 4 |
| 1.3 | 1.15 | 2.61 | 2.27 | 4.54 |
| 1.6 | 0.96 | 2.42 | 2.52 | 5.04 |
| 1.7 | 0.92 | 2.39 | 2.6 | 5.2 |
| 2 | 0.77 | 2.28 | 2.96 | 5.92 |
| 2.3 | 0.67 | 2.23 | 3.33 | 6.66 |
| 2.5 | 0.62 | 2.20 | 3.33 | 7.1 |

Additional details concerning the theoretical basis for the calculations may be found in a paper entitled "Effect of Ceramic Anisotropy on the Properties of Ceramic/Polymer Piezoelectric Composites" by the inventors herein, Proc. of 1987 Ultrasonic Symposium, October, 1987 and the references cited therein.

In pulse echo operation the transducer shows a resonance peak at 2 Megahertz and a group of resonance frequencies between 4.3 and 5.0 Megahertz. Simple inductive tuning provides two clean resonance peaks.

The use of a composite disk in a multifrequency ultrasonic imaging system is illustrated in FIG. 5. Composite disc 10 is placed in a cylindrical housing 20 of a transducer 18. A front electrode 22a and a rear electrode 22b contact the opposite ends of the piezoelectric bars 12 as described above, and as is well known in the art. Matching layers 24a and 24b match the acoustic impedance of the composite disc 10 to the medium into which ultrasound is propagated. The acoustic impedance and thickness of the matching layer or layers 24a and 24b are selected in a manner well known in the art. A backing layer 26 which absorbs acoustic energy and serves to limit the ringing of composite disc 10 is affixed to back electrode 26b. Electrical connections are made to front electrode 22a and back electrode 22b with leads 28a and 28b.

Referring FIG. 6 transducer assembly 18 is electrically connected to a pulse generator 30 having a pulsed oscillator capable of operating at more than one frequency and denoted by frequency selector 32. Pulses from frequency selector 32 are amplified by an amplifier 34 and applied between front electrode 22a and back electrode 22b to excite composite disc 10 to produce ultrasonic pulses.

The frequencies of operation of frequency selector 32 are selected to correspond to the primary resonance frequencies of transducer 18. As noted in the example above, these may be 2.0 and 5.0 Megahertz. Typically, a switch is provided so that the operator of the system can switch between frequencies as desired.

When ultrasonic pulses rom transducer 18 are reflected back to transducer 18 they are received by a receiver 36. Receiver 36 includes an amplifier 38 capable of amplifying signals at any of the frequencies of the pulses supplied by frequency selector 32. The output of amplifier 38 is provided to a signal processor 40 which processes the signals in any manner well known in the art. For example, analog signals may be converted to digital signals.

The processed signals from signal processor 40 are provided to a display unit 42. Using the signals, and signals indicative of the position of the transducer 18, an image is generated, by display unit 42, of a cross section of an object into which ultrasound from transducer 18 is propagated and returned.

Thus, although the invention has been described with reference to a particular embodiment it is to be understood that the embodiment is merely illustrative of the application of the principles of the invention. Numerous modifications may be made therein and other arrangements may be devised without departing from the spirit and scope of the invention.

What is claimed is:

1. An ultrasonic transducer system comprising an assembly including a plurality of rigid piezoelectric elements in a relatively less rigid matrix, said piezoelectric elements being arranged in said matrix in a 1-3 structure, said piezoelectric elements having a width-to-thickness ratio of between substantially 1.6 and substantially 2.5.

2. The ultrasonic transducer system of claim 1, wherein said piezoelectric elements occupy between substantially twenty percent and substantially thirty percent by volume of said assembly.

3. The ultrasonic transducer system of claim 1, wherein said piezoelectric elements are of substantially square cross section.

4. The ultrasonic transducer system of claim 1, wherein said assembly is shaped as a disc and said piezoelectric elements extend in a direction parallel to a longitudinal axis of said disc.

5. The ultrasonic transducer system of claim 4, wherein said piezoelectric elements extend from a first planar surface of said disc to a second planar surface of said disc.

6. The ultrasonic transducer system of claim 1, wherein said piezoelectric elements are formed of a polarized ceramic material.

7. The ultrasonic transducer system of claim 1, wherein said piezoelectric elements are formed from lead zirconate titanate.

8. The ultrasonic transducer system of claim 1, wherein said matrix is formed from a cured polymer resin.

9. The ultrasonic transducer assembly of claim 1, wherein said cured polymer resin is one of epoxy or polyurathane.

10. The ultrasonic transducer system of claim 1, further comprising electrical connection means for making electrical connections to said assembly to permit excitation of said piezoelectric elements.

11. The ultrasonic transducer system of claim 10, further comprising an electrical generator for providing electrical excitation to said piezoelectric elements by way of said electrical connection means.

12. The ultrasonic transducer system of claim 11, wherein said electrical generator includes a frequency selector means for determining a frequency at which said electrical generator provides excitation to said piezoelectric elements.

13. The ultrasonic transducer system of claim 12, wherein said frequency selector means provides electrical excitation to said piezoelectric elements of said assembly at a first frequency and at a second frequency, said first frequency being for exciting a thickness resonant mode of vibration of said piezoelectric elements, and said second frequency being for exciting a lateral resonant mode of vibration of said piezoelectric elements.

14. The ultrasonic transducer system of claim 13, wherein said thickness resonant mode of vibration is a fundamental thickness mode of vibration and said lateral resonant mode of vibration is a fundamental lateral mode of vibration of said piezoelectric elements.

15. The ultrasonic transducer system of claim 13, wherein said width-to-thickness ratio is selected so that said thickness resonant mode of vibration occurs at a frequency equal to approximately 2.5 times that of said lateral resonant mode of vibration.

16. The ultrasonic transducer system of claim 13, wherein said electrical generator provides electrical pulses at said first frequency and at said second frequency to said piezoelectric elements, further comprising a receiver for processing electrical signals from said piezoelectric elements, said electrical signals resulting from reflections of ultrasonic pulses produced by said electrical pulses.

17. The ultrasonic transducer system of claim 16, wherein said receiver includes an amplifier for amplifying said electrical signals at said first frequency and at said second frequency.

18. The ultrasonic transducer system of claim 16, wherein said receiver further comprises a signal processing means for processing said electrical signals into processed signals, and a display means for producing a visual display from said processed signals.

19. The ultrasonic transducer system of claim 10, further comprising an acoustic impedance matching layer acoustically coupled to said assembly for matching acoustic impedance of said assembly to acoustic impedance of a medium into which ultrasound from said transducer system is to be propagated.

20. The ultrasonic transducer system of claim 19, further comprising an acoustic damping medium acoustically coupled to said assembly for absorbing acoustic energy from said assembly to damp vibration thereof.

21. A ultrasonic transducer system comprising an assembly including a plurality of rigid piezoelectric elements in a relatively less rigid matrix, said piezoelectric elements being arranged in said matrix in a 1-3 structure, said piezoelectric elements having a width-to-thickness ratio of between substantially 1.0 and substantially 2.5;
an electrical connection means for making electrical connections to said assembly to permit excitation of said piezoelectric elements; and
an electrical generator for providing electrical excitation to said piezoelectric elements by way of said electrical connection means;
said electrical generator including a frequency selector means for determining a frequency at which said electrical generator provides excitation to said piezoelectric elements; and
said frequency selector means providing electrical excitation to said piezoelectric elements of said assembly at a first frequency and at a second frequency, said first frequency being for exciting a thickness resonant mode of vibration of said piezoelectric elements, and said second frequency being for exciting a lateral resonant mode of vibration of said piezoelectric elements.

22. The ultrasonic transducer system of claim 21, wherein said thickness resonant mode of vibration is a fundemental thickness mode of vibration and said lateral resonant mode of vibration is a fundemental lateral mode of vibration of said piezoelectric elements.

23. The ultrasonic transducer system of claim 21, wherein said width-to-thickness ratio is selected so that said thickness resonant mode of vibration occurs at a frequency equal to approximately 2.5 times that of said lateral resonant mode of vibration.

24. The ultrasonic transducer system of claim 21, wherein said electrical generator provides electrical pulses at said first frequency and at said second frequency to said piezoelectric elements, further comprising a receiver for processing electrical signals from said piezoelectric elements, said electrical signals resulting from reflections of ultrasonic pulses produced by said electrical pulses.

25. The ultrasonic transducer system of claim 24, wherein said receiver includes an amplifier for amplifying said electrical signals at said first frequency and at said second frequency.

26. The ultrasonic transducer system of claim 24, wherein said receiver further comprises a signal processing means for processing said electrical signals into processed signals, and a display means for producing a visual display from said processed signals.

* * * * *